(12) United States Patent
Oberschmid (10) Patent No.: US 9,159,658 B2
(45) Date of Patent: Oct. 13, 2015

(54) CONNECTION CARRIER FOR SEMICONDUCTOR CHIPS AND SEMICONDUCTOR COMPONENT

(75) Inventor: Reimund Oberschmid, Sinzing (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 74 days.

(21) Appl. No.: 14/005,105

(22) PCT Filed: Mar. 16, 2012

(86) PCT No.: PCT/EP2012/054713
§ 371 (c)(1),
(2), (4) Date: Oct. 13, 2013

(87) PCT Pub. No.: WO2012/126852
PCT Pub. Date: Sep. 27, 2012

(65) Prior Publication Data
US 2014/0027921 A1 Jan. 30, 2014

(30) Foreign Application Priority Data
Mar. 21, 2011 (DE) .......................... 10 2011 014 584

(51) Int. Cl.
*H05K 1/02* (2006.01)
*H01L 23/498* (2006.01)
*H01L 33/62* (2010.01)
*H01L 33/64* (2010.01)
*H05K 1/11* (2006.01)

(52) U.S. Cl.
CPC ........ *H01L 23/498* (2013.01); *H01L 23/49811* (2013.01); *H05K 1/0271* (2013.01); *H01L 33/62* (2013.01); *H01L 33/647* (2013.01); *H01L 2224/16225* (2013.01); *H01L 2224/81385* (2013.01); *H01L 2924/01322* (2013.01); *H05K 1/111* (2013.01); *H05K 2201/0133* (2013.01); *H05K 2201/09036* (2013.01); *H05K 2201/09263* (2013.01); *H05K 2201/10106* (2013.01)

(58) Field of Classification Search
None
See application file for complete search history.

(56) References Cited

U.S. PATENT DOCUMENTS

| | | | | |
|---|---|---|---|---|
| 5,759,047 A | * | 6/1998 | Brodsky et al. | 439/66 |
| 6,097,610 A | * | 8/2000 | Hashimoto | 361/760 |
| 6,507,113 B1 | * | 1/2003 | Fillion et al. | 257/737 |
| 6,627,872 B1 | | 9/2003 | Fukamura et al. | |
| 7,253,514 B2 | * | 8/2007 | Legen et al. | 257/696 |
| 2003/0121698 A1 | * | 7/2003 | Kyougoku et al. | 174/261 |
| 2007/0145403 A1 | * | 6/2007 | Tomioka et al. | 257/99 |
| 2009/0115073 A1 | * | 5/2009 | Sunohara et al. | 257/778 |
| 2012/0146210 A1 | * | 6/2012 | Oganesian et al. | 257/723 |

FOREIGN PATENT DOCUMENTS

DE 10332303 A1 2/2005
DE 102005025754 A1 12/2006
(Continued)

*Primary Examiner* — Ha Tran T Nguyen
*Assistant Examiner* — Jordan Klein
(74) *Attorney, Agent, or Firm* — Slater & Matsil, L.L.P.

(57) ABSTRACT

A connection carrier for at least one semiconductor chip is disclosed. The connection carrier has a carrier body having a main surface. A first connection area and a second connection area at a distance from the first connection area are formed on the main surface. The connection carrier has a mechanical decoupling device which is intended to reduce transmission of mechanical forces from the carrier body to at least one region of the first connection area. A semiconductor component having such a connection carrier is also stated.

16 Claims, 4 Drawing Sheets

(56) References Cited

FOREIGN PATENT DOCUMENTS

| | | | |
|---|---|---|---|
| EP | 2058859 | A2 | 5/2009 |
| JP | 2001094227 | A | 4/2001 |
| JP | 2003198068 | A | 7/2003 |
| JP | 2006-303191 | A | 11/2006 |
| JP | 2007027521 | A | 2/2007 |
| WO | 9206495 | A1 | 4/1992 |
| WO | 2009104668 | A1 | 8/2009 |

* cited by examiner

CONNECTION CARRIER FOR SEMICONDUCTOR CHIPS AND SEMICONDUCTOR COMPONENT

This patent application is a national phase filing under section 371 of PCT/EP2012/054713, filed Mar. 16, 2012, which claims the priority of German patent application 10 2011 014 584.2, filed Mar. 21, 2011, each of which is incorporated herein by reference in its entirety.

TECHNICAL FIELD

The present application relates to a connection carrier for at least one semiconductor chip, and to a semiconductor component having such a connection carrier.

BACKGROUND

In optoelectronic semiconductor chips, for example LED chips, which are fastened and electrically contacted with two contacts on the lower side on a connection carrier, mechanical stresses due, for example, to thermal expansion of the connection carrier, or bending of the connection carrier as a result of a mechanical load, can lead to one of the electrical connections between the semiconductor chip and the connection carrier detaching and the semiconductor chip failing.

SUMMARY OF THE INVENTION

Embodiments of the invention provide a connection carrier in which the risk of a connection to a semiconductor chip fastened on the connection carrier detaching is reduced.

According to one embodiment, a connection carrier for at least one semiconductor chip comprises a carrier body having a main surface. A first connection surface and a second connection surface, separated from the first connection surface, are formed on the main surface. The connection carrier comprises a mechanical decoupling device, which is intended in particular to reduce transmission of mechanical forces from the carrier body onto at least one region of the first connection surface, in particular onto a connecting region of the first connection surface. The connecting region is preferably provided for electrical connection to an electrical contact of a semiconductor chip, a connecting layer between the first connection surface and the contact of the semiconductor chip directly adjoining the first connection surface in the connecting region.

A mechanical decoupling device is generally intended, in particular, to mean a region of the connection carrier which is intended for controlled attenuation of mechanical stresses occurring in the event of bending of the carrier body and/or a temperature change of the carrier body, at least in a region intended for fastening a semiconductor chip. The direct force transmission onto a region, intended for connection to a semiconductor chip, of the first connection surface when a mechanical force acts on the carrier body is reduced in comparison with an unstructured, homogeneously formed carrier body having a connection surface applied thereon.

The risk that a semiconductor chip fastened and electrically contacted on the connection carrier, in particular, on the first connection surface and the second connection surface, will detach in the event of temperature variations and/or in the event of mechanical loading of the carrier body, is thus reduced. Even when there are different thermal expansion coefficients for the connection carrier and the semiconductor chip, permanent and reliable electrical connection is ensured.

In one configuration variant, the mechanical decoupling device is formed by means of a recess in the carrier body. The recess is preferably formed on the side of the main surface of the connection carrier. In a vertical direction, i.e., in a direction extending perpendicularly to the main surface of the connection carrier, the recess preferably does not extend fully through the carrier body.

In a preferred refinement, the recess is at least partially filled with a filler material. The filler material preferably has a lower modulus of elasticity than the carrier body. In other words, the filler material is softer than the material of the carrier body. Preferably, the modulus of elasticity of the filler material is at most 0.7 times, particularly preferably at most 0.5 times, the modulus of elasticity of the carrier body. By means of the filler material, which is softer in comparison with the carrier body, mechanical stresses acting on the carrier body, for example compressive or tensile stresses, can only affect the connection to at least one electrical contact of the semiconductor chip to a reduced extent.

In another configuration variant, the mechanical decoupling device is formed by means of a bead. The bead is preferably formed in the filler material with which the recess is filled. The bead may, however, also be formed in the carrier body itself. A spring effect can be achieved by means of the bead, so that the connecting region of the first connection surface is mechanically decoupled from the carrier body.

In plan view of the connection carrier, the recess preferably overlaps with the first connection surface. In particular, the connecting region is preferably arranged fully inside the recess. Furthermore, in plan view of the connection carrier, the recess may preferably overlap with the first connection surface and with the second connection surface. The extent of the recess in plan view of the connection carrier may be 50% or more of the base surface of the semiconductor chip to be fastened.

At least in a lateral direction, the recess may extend beyond the lateral extent of the semiconductor chip, for example by between 1% inclusive and 50% inclusive, preferably by between 1% inclusive and 30% inclusive, of the lateral extent of the semiconductor chip along this direction.

In another configuration variant, the mechanical decoupling device is formed by a meandering region of the first connection surface. By means of the meandering region, a shear stress between the contacts of the semiconductor chip can be reduced by a spring effect.

Preferably, the mechanical decoupling device is formed by means of the meandering region and the recess, the recess preferably being formed at least locally along an outer border of the meandering region. The recess may be filled or unfilled.

In another configuration variant, the mechanical decoupling device is formed by means of a region of the first connection surface, in which the first connection surface bears freely on the main surface. In other words, the region of the first connection surface is not mechanically connected directly to the main surface of the carrier, so that a bending stress of the carrier body has only a reduced effect in the connecting region, which is intended for fastening the semiconductor chip, of the first connection surface.

The second connection surface is preferably larger than the first connection surface. Preferably, the second connection surface is at least 1.5 times as large, particularly preferably at least 3 times as large, as the first connection surface. The mechanically stable fastening of the semiconductor chip is preferably carried out predominantly via the second connection surface. The first connection surface is preferably configured in such a way that the connection to the semiconductor chip is not detached even when the connection carrier is mechanically loaded.

In another preferred configuration, an outer border of the second connection surface comprises at least two points, an imaginary direct connecting line extending between these points extending outside the second connection surface, and furthermore preferably through the first connection surface. A configuration in which the second connection surface is substantially larger than the first connection surface can thus be achieved in a straightforward way.

In a preferred refinement, the outer border of the second connection surface extends at least locally along at least two side surfaces, particularly preferably along three side surfaces, of the first connection surface. In other words, the second connection surface locally encloses the first connection surface, in particular the connecting region.

A semiconductor component comprising such a connection carrier preferably has at least one semiconductor chip, particularly preferably a multiplicity of, in particular, optoelectronic semiconductor chips. The at least one semiconductor chip has a first contact and a second contact on a lower side facing the connection carrier, the first contact being electrically conductively connected to the first connection surface and the second contact being electrically conductively connected to the second connection surface.

BRIEF DESCRIPTION OF THE DRAWINGS

Other features, configurations and expediencies may be found in the following description of the exemplary embodiments in connection with the figures, in which.

Elements which are the same or of the same type, or which have the same effect are provided with the same references in the figures.

The figures and the size proportions of the elements represented in the figures with respect to one another are not to be regarded as true to scale. Rather, individual elements may be represented exaggeratedly large for better representability and/or for better comprehensibility.

DETAILED DESCRIPTION OF ILLUSTRATIVE EMBODIMENTS

Figure 1A:
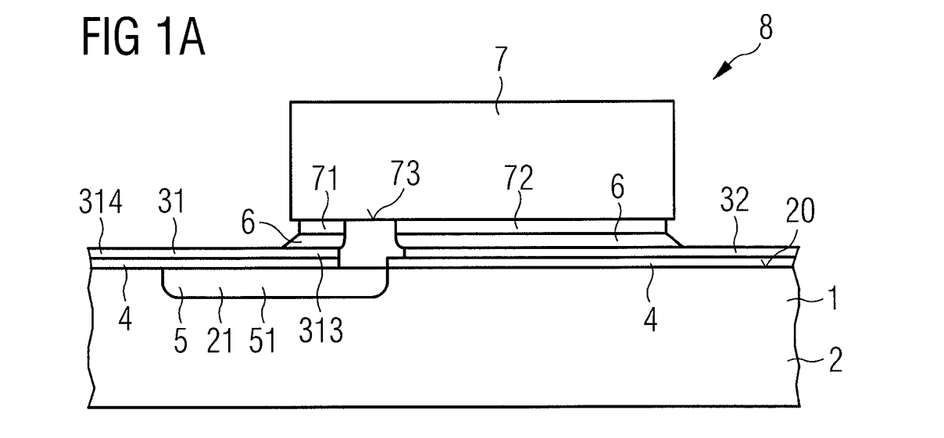
FIGS. 1A and 1B show a first exemplary embodiment of a semiconductor component having a connection carrier in schematic plan view (FIG. 1B) and associated sectional view along the line A-A' (FIG. 1A)
Figure 1B:
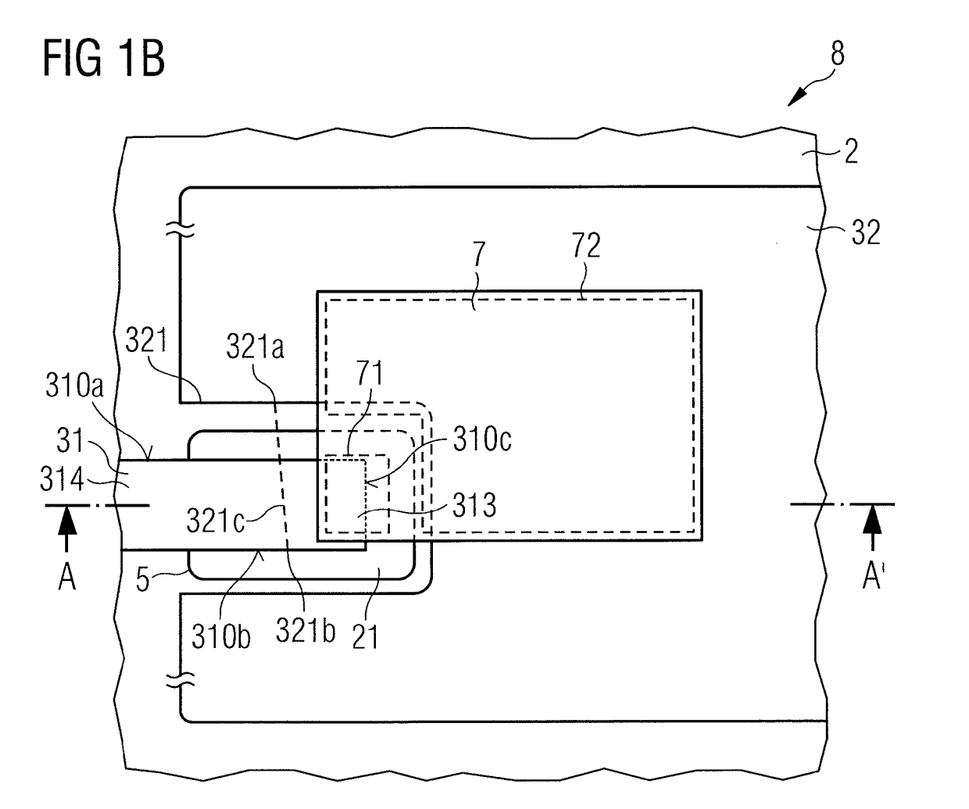

A semiconductor component 8 according to the first exemplary embodiment as represented in FIGS. 1A and 1B comprises a connection carrier 1, on which a semiconductor chip 7 is fastened. On a lower side of the semiconductor chip 7 facing the connection carrier 1, the semiconductor chip, which may, for example, be configured as an LED semiconductor chip or as a laser diode semiconductor chip, has a first contact 71 and a second contact 72, via which, by applying an external electrical voltage, charge carriers can be injected into the semiconductor chip 7 and recombine therein while emitting radiation in an active region (not explicitly represented) intended for the generation of radiation. The contacts 71, 72 are arranged on a lower side of the semiconductor chip facing the connection carrier 1. For the contacts, for example, a metal layer or a layer sequence comprising a plurality of metal layers is suitable. The contacts may be applied by vapor deposition or sputtering. The contacts, or at least one layer thereof, may, for example, contain gold or consist of gold.

The connection carrier 1 has a carrier body 2 having a main surface 20 facing the semiconductor chip. On the main surface, an insulation layer 4 is formed, for example, an oxide layer, for instance a silicon oxide layer or a nitride layer, for instance a silicon nitride layer. On the side of the insulation layer 4 facing away from the carrier body 2, a first connection surface 31 and a second connection surface 32, separated and electrically insulated from the first connection surface, are formed.

By means of a connecting layer 6, for example, a solder layer or an electrically conductive adhesive layer, the first connection surface 31 is electrically conductively connected to the first contact 71 and the second connection surface 32 is electrically conductively connected to the second contact 72. The first connection surface comprises a connecting region 313, which is intended for connection to the first contact 71 and in which the connecting layer 6 directly adjoins the first connection layer.

For the connecting layer 6, a soft solder is, for example, suitable, for instance a tin-containing solder such as an indium-tin solder or a gold-tin solder (eutectic melting point about 280° C.).

For the connection surfaces 31, 32, copper is, for example, suitable. The thickness of the connection surfaces preferably lies between 10 μm inclusive and 60 μm inclusive.

The connection carrier 1 comprises a mechanical decoupling device 5, which in this exemplary embodiment is formed by means of a recess 21. The recess is formed from the main surface 20 in the carrier body 2. The recess is filled with a filler material 51. A modulus of elasticity of the filler material is preferably at most 0.7 times as great, particularly preferably at most half as great, as the modulus of elasticity of the carrier body 2. The modulus of elasticity of the filler material may also be a factor of 10 or more less than the modulus of elasticity of the carrier body. The filler material may be introduced into the recess 21, for example, cast or pressed, or be fastened in already prefabricated form on the carrier body 2, for example, by means of adhesive bonding into the recess 21.

The filler material 51 is preferably formed so as to be electrically insulating. Expediently, in addition to a low modulus of elasticity, the filler material also has a high thermal conductivity.

The filler material 51 may, for example, contain an elastomer or an elastomer alloy, a rubber or a silicate, or consist of such a material. The modulus of elasticity of the filler material is preferably between 0.01 GPa inclusive and 1 GPa inclusive.

The mechanical decoupling device 5 is formed in such a way that the mechanical load-bearing capacity of the connection to the first contact 71 of the semiconductor chip is not overstressed. For example, with a contact having a size of (0.6 mm)$^2$ and a connecting layer bonding strength of 100 N/mm$^2$, the maximum stress due to tensile or shear forces should not exceed 0.4 N.

In plan view of the connection carrier 1, the recess 21 overlaps with the first connection surface 31. In plan view of the semiconductor component 8, the connecting region 313 and the first contact 71 extend congruently or essentially congruently. In plan view of the connection carrier 1, the connecting region 313 and furthermore also the first contact 71 are arranged fully inside the recess 21, so that the connecting region 313, and therefore the connection between the first contact 71 and the connection carrier 1, is mechanically decoupled from the carrier 2 by means of the mechanical decoupling device 5.

A supply region 314, provided for the electrical current supply, of the first connection surface 31 extends beyond the recess 21 in plan view.

The risk of damage to the connection between the first connection surface 31 and the first contact 71 in the event of a bending stress on the carrier body 2, for example, due to thermal expansion of the connection carrier having a different expansion coefficient than the semiconductor chip 7, or due to a mechanical load acting externally on the carrier body 2, is reduced by means of the filled recess 21.

In plan view of the connection carrier 1, an outer border 321 of the second connection layer 32 extends along three side surfaces 310a, 310b, 310c of the first connection surface 31, the side surface 310b connecting together the opposing and preferably mutually parallel side surfaces 310a and 310c. The second connection surface 32 thus encloses the first connection surface 31, in particular the connecting region 313. It is thus readily possible to produce a substantially larger second connection surface 32 in comparison with the first connection surface 31.

The second connection surface is preferably at least 1.5 times as large as the first connection surface, particularly preferably at least 3 times as large as the first connection surface. In addition to the electrical contacting, the second connection surface is preferably also used for thermal dissipation of the heat loss generated in the semiconductor chip during operation.

In the vicinity of the connecting region 313 of the first connection surface 31, the second connection surface 32 is recessed so that, in plan view, an imaginary connecting line (illustrated in FIG. 1B by a dashed line 321c) between two points 321a, 321b on the outer border 321 of the second connection surface extends outside the second connection surface and partially also through the first connection surface 31.

The carrier body 2 may be formed by an electrically conductive material, for example a metal sheet, which may preferably have a thickness of between 100 μm inclusive and 1 mm, preferably between 200 μm inclusive and 500 μm inclusive, for example a thickness of about 200 μm.

Figure 3:
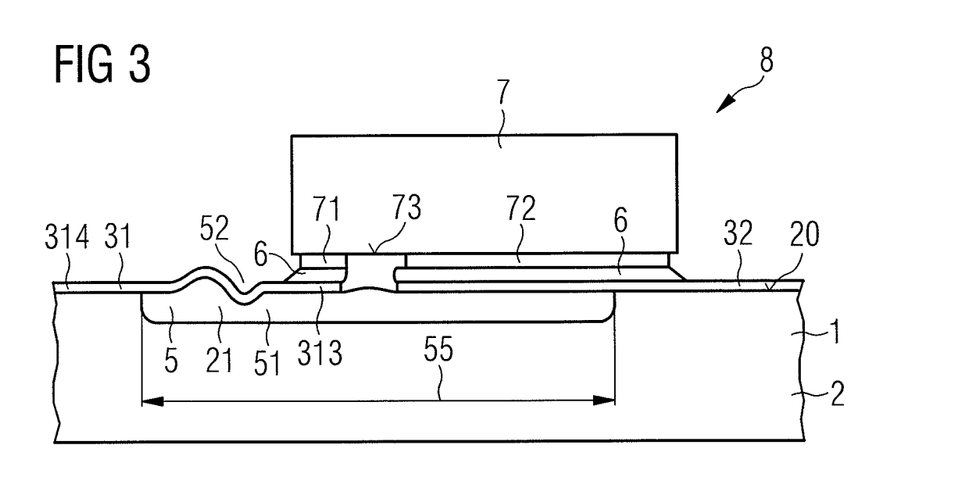
FIG. 3 shows a third exemplary embodiment of a semiconductor component having a connection carrier in schematic sectional view.

As an alternative, an electrically insulating material may also be employed for the carrier body 2, for example a plastic, which is preferably relatively thick, for example, having a thickness of between 0.3 mm and 1.5 mm, and tough, and furthermore ensures a high level of thermal dissipation. In the case of an electrically insulating carrier body, the insulation layer 4 is not necessary and may also be omitted, as represented in FIG. 3.

For example, an acrylic glass, a polystyrene or a polyamide is suitable as a plastic for the carrier body.

A modulus of elasticity of the carrier body preferably lies between 1 GPa inclusive and 50 GPa inclusive.

An electrically insulating carrier body 2 is preferably formed, with respect to its voltage breakdown strength, in such a way that it fulfills the requirements of a fully insulated device even in the case of a mains potential, for example 220 V, applied to the connection surfaces 31, 32.

Unlike in the exemplary embodiment represented, the carrier body may also be multilayered. For example, a plastic may be underlaid with, or adhesively bonded to, a stiffening metal layer on the lower side, for example a metal sheet, for instance an iron sheet. The metal layer, in particular the metal sheet, may for example have a thickness of between 0.3 mm inclusive and 0.8 mm inclusive.

For simplified representation, only a region of the connection carrier on which a semiconductor chip 7 is fastened is represented. Preferably, a plurality of semiconductor chips are fastened on the connection carrier 1 and electrically conductively connected thereto, for example at least partially electrically in series and/or at least partially electrically in parallel with one another. An LED semiconductor chip lighting chain, for example for general LED lighting, can thus be produced particularly economically.

Figure 2A:
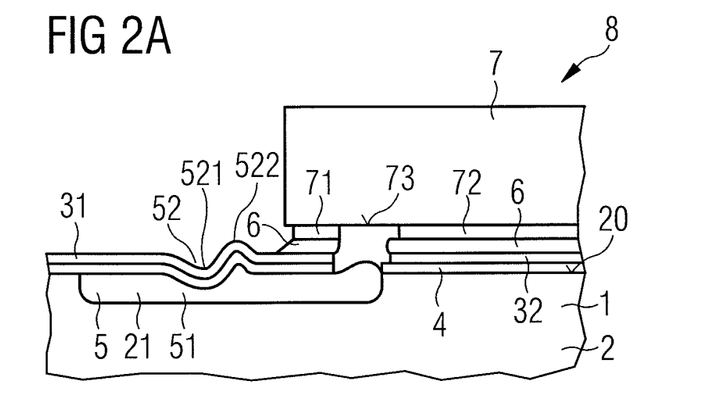
FIGS. 2A and 2B show a second exemplary embodiment of a semiconductor component having a connection carrier in schematic plan view (FIG. 2B) and associated sectional view along the line B-B' (FIG. 2A)
Figure 2B:
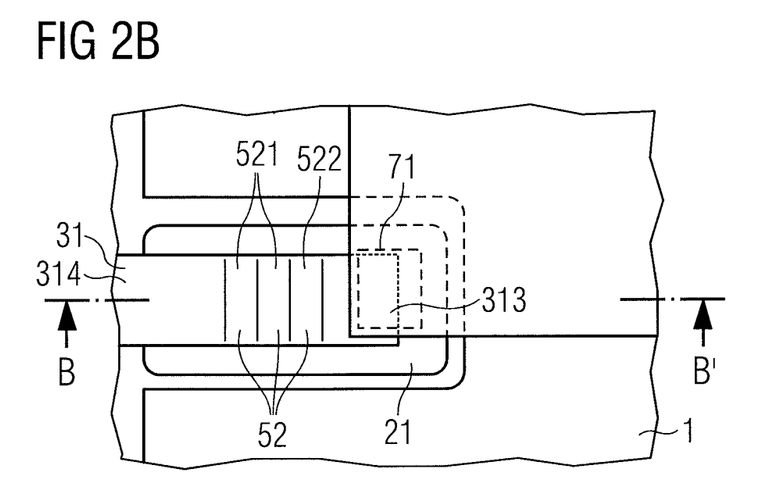

The second exemplary embodiment as represented in FIGS. 2A and 2B essentially corresponds to the first exemplary embodiment as described in connection with FIGS. 1A and 1B. In contrast thereto, a bead 52 is formed in the filler material 51 of the recess 21. The bead may already be shaped, for example by pressing, before the first connection surface 31 is formed. The bead 52 causes a spring effect, by which mechanical stresses acting on the carrier body 2 can be reduced in respect of transmission to the connection of the first connection surface to the first contact surface 71. In relation to the main surface 20 of the carrier body, the bead comprises at least one indentation 521 and one elevation 522. In sectional view, the shape of the first connection surface 31 follows the shape of the bead 52. Unlike in the exemplary embodiment described, the bead may also be formed directly in the carrier body 2.

The third exemplary embodiment of a semiconductor component, as represented in FIG. 3, essentially corresponds to the first exemplary embodiment described in connection with FIG. 1. In contrast thereto, the recess 21 overlaps with the first connection surface 31 and the second connection surface 32 in plan view of the connection carrier 1. The lateral extent of the recess is illustrated by means of an arrow 55 in the figure. Unlike in the exemplary embodiment described, the recess 21 may also extend fully beyond the semiconductor chip 7 at least along a lateral direction, and therefore have a greater extent than the semiconductor chip. For example, the recess may extend beyond the semiconductor chip in plan view on one side by between 1% inclusive and 50% inclusive, preferably by between 1% inclusive and 30% inclusive, in relation to the lateral extent of the semiconductor chip.

A comparatively large-area configuration of the recess 21 is expedient in particular when the thermal conductivity of the filler material 51 is as high as, or at least only insubstantially less than, for example by at most 30%, the thermal conductivity of the material of the carrier body 2. The protection of the connection of the semiconductor chip 7 to the connection carrier 1 can thus be further improved.

In the exemplary embodiment shown, the carrier body 2 is formed so as to be electrically insulating, so that an insulation layer on the main surface 20 of the carrier body is not necessary. In contrast thereto, in this exemplary embodiment the carrier body 2 may also be formed so as to be electrically conductive and may have an insulation layer 4 configured as described in connection with FIGS. 1A and 1B.

Figure 4A:
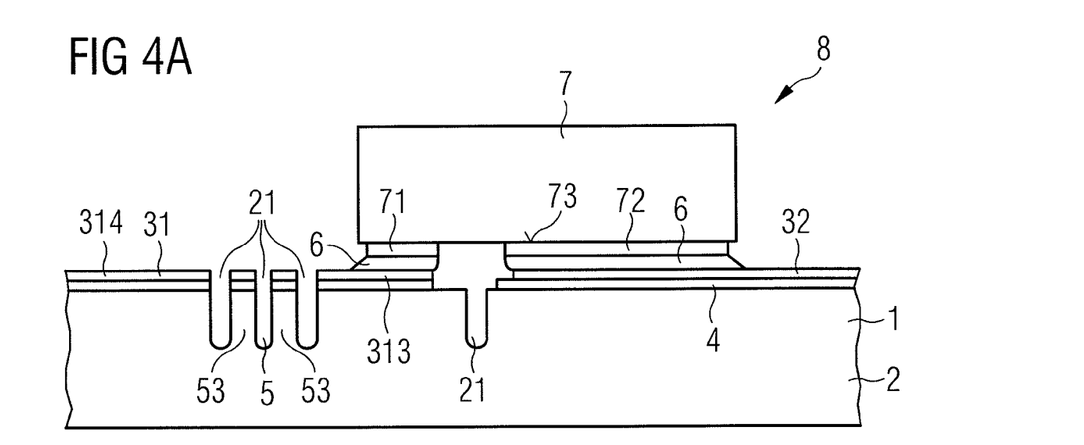
FIGS. 4A and 4B show a fourth exemplary embodiment of a semiconductor component having a connection carrier in schematic plan view (FIG. 4B) and associated sectional view along the line C-C' (FIG. 4A)
Figure 4B:
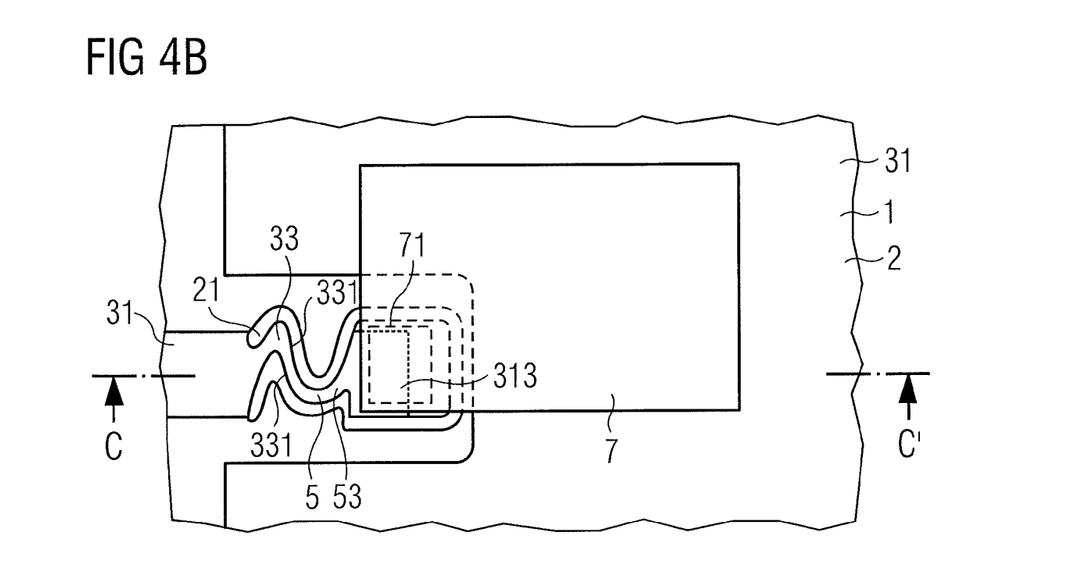

The fourth exemplary embodiment, as represented in FIGS. 4A and 4B, essentially corresponds to the first exemplary embodiment as described in connection with FIGS. 1A and 1B.

In contrast thereto, the mechanical decoupling device 5 is formed by means of a meandering region 33 of the first connection surface 31. The meandering region is formed between the supply region 314 and the connecting region 313. Along an outer border 331 of the meandering region 33, a recess 21 is locally formed in the carrier body 2. The recess 21 extends between the first connection surface 31 and the second connection surface 32. Furthermore, the recess 21 extends along two opposite sides of the meandering region 33. For simplified representation, only one bending period is shown for the meandering region. In order to improve the mechanical decoupling, however, two or more such bending periods may also be provided, for example between 2 inclusive and 5 inclusive bending periods.

By means of the recess 21, a columnar region 53 of the carrier body 2 is formed. The columnar region 53, with the meandering region 33 formed thereon as an electrical supply, causes a spring effect which leads to mechanical decoupling of the connection to the first contact 71 from the carrier body 2. The recess 21 may, for example, be formed by means of milling, for example by means of a fine face cutter, or by embossing. For even further reinforcement of the spring effect, the recess may be formed laterally overhanging at least locally (this is not explicitly represented in the figure). Such a recess may, for example, be produced by means of etching.

In this exemplary embodiment, the recess 21 is preferably free of any filler material. In contrast thereto, however, a filler material, which may in particular be configured as described in connection with FIGS. 1A and 1B, may also be provided at least locally.

Figure 5:
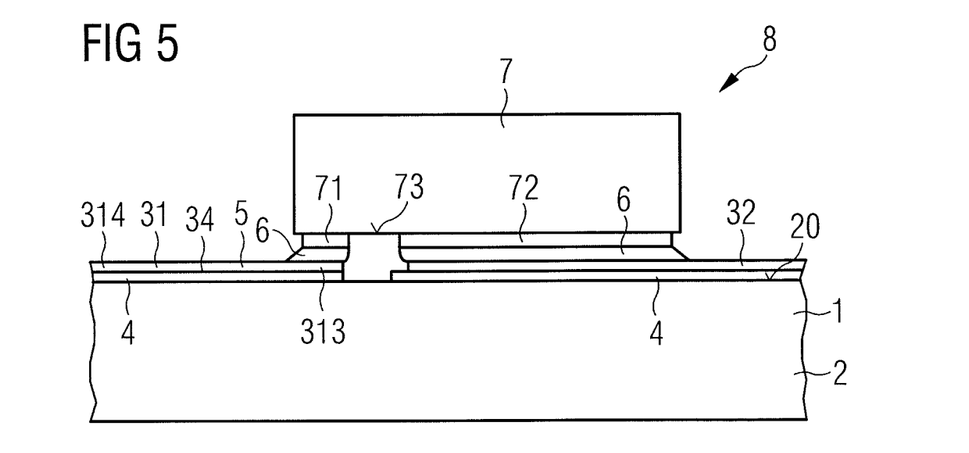
FIG. 5 shows a fifth exemplary embodiment of a semiconductor component in schematic sectional view.

The fifth exemplary embodiment as represented in FIG. 5 essentially corresponds to the first exemplary embodiment as described in connection with FIGS. 1A and 1B. In contrast thereto, the carrier body 2 is free of any recess. The mechanical decoupling device 5 is formed by means of a freely bearing region 34 of the first connection surface 31. The connecting region 313 is arranged fully inside the freely bearing region 34. In the freely bearing region, there is no direct force-fit connection between the first connection surface 31 and the carrier body 2. This may, for example, be achieved by the connection surface 31 being fastened, for example adhesively bonded, on the carrier body 2 only locally.

By the description with the aid of the exemplary embodiments, the invention is not restricted to these exemplary embodiments. Rather, the invention covers any new feature and any combination of features, which includes in particular any combination of features in the patent claims, even if this feature or this combination is not explicitly indicated per se in the patent claims or in the exemplary embodiments.

The invention claimed is:

1. A connection carrier for at least one semiconductor chip, the connection carrier comprising:
a carrier body having a main surface;
a first connection surface and a second connection surface separated from the first connection surface disposed on the main surface; and
a mechanical decoupling device configured to reduce transmission of mechanical forces from the carrier body onto at least one region of the first connection surface, the mechanical decoupling device being formed by a meandering region of the first connection surface, wherein the meandering region is formed on a columnar region of the carrier body, the columnar region being formed by a recess in the carrier body.

2. The connection carrier according to claim 1, wherein the recess overlaps with the first connection surface and with the second connection surface in plan view of the connection carrier.

3. The connection carrier according to claim 1, wherein the second connection surface is at least 1.5 times as large as the first connection surface.

4. The connection carrier according to claim 1, wherein an outer border of the second connection surface comprises two points, an imaginary direct connecting line extending between the two points extending through the first connection surface.

5. The connection carrier according to claim 1, wherein an outer border of the second connection surface extends at least locally along three side surfaces of the first connection surface.

6. A semiconductor component comprising:
a connection carrier; and
a semiconductor chip,
wherein the connection carrier comprises a carrier body having a main surface, wherein the connection carrier comprises a first connection surface and a second connection surface separated from the first connection surface disposed on the main surface, wherein the second connection surface is at least 1.5 times as large as the first connection surface, wherein the connection carrier comprises a mechanical decoupling device configured to reduce transmission of mechanical forces from the carrier body to at least one region of the first connection surface, wherein the semiconductor chip has exactly two contacts, a first contact and a second contact on a lower side facing the connection carrier, wherein the first contact is electrically connected to the first connection surface and the second contact is electrically connected to the second connection surface, and wherein the second connection surface does not have a mechanical decoupling device.

7. The semiconductor component according to claim 6, wherein the mechanical decoupling device is formed by a recess in the carrier body.

8. The semiconductor component according to claim 7, wherein the recess is filled with a filler material that has a lower modulus of elasticity than the carrier body.

9. The semiconductor component according to claim 7, wherein the modulus of elasticity of the filler material is at most 0.7 times the modulus of elasticity of the carrier body.

10. The semiconductor component according to claim 8, wherein the mechanical decoupling device is formed by a bead that is formed in the filler material.

11. The semiconductor component according to claim 6, wherein the mechanical decoupling device is formed by a bead.

12. The semiconductor component according to claim 6, wherein the mechanical decoupling device is formed by a meandering region of the first connection surface.

13. The semiconductor component according to claim 12, wherein the mechanical decoupling device is formed by a recess, the recess being formed locally along an outer border of the meandering region.

14. The semiconductor component according to claim 6, wherein the mechanical decoupling device is formed by a region of the first connection surface, wherein the first connection surface bears freely on the main surface in the region.

15. The semiconductor component according to claim 6, wherein the mechanical decoupling device is formed by a meandering region of the first connection surface, wherein the meandering region is formed on a columnar region of the carrier body, the columnar region being formed by a recess in the carrier body.

16. The semiconductor component according to claim 6, wherein the second connection surface is at least 3 times as large as the first connection surface.

* * * * *